United States Patent [19]

Schweitzer, Jr.

[11] Patent Number: 4,550,288
[45] Date of Patent: Oct. 29, 1985

[54] VOLTAGE LOSS SENSOR AND ALARM

[76] Inventor: Edmund O. Schweitzer, Jr., 2433 Center St., Northbrook, Ill. 60062

[21] Appl. No.: 518,536

[22] Filed: Jul. 29, 1983

[51] Int. Cl.⁴ .................................. G01R 19/14
[52] U.S. Cl. ................................. 324/133; 340/664
[58] Field of Search .................. 324/133, 51, 127; 340/664, 660, 663

[56] References Cited

U.S. PATENT DOCUMENTS

| | | | |
|---|---|---|---|
| 3,524,133 | 8/1970 | Arndt | 340/664 X |
| 3,969,710 | 7/1976 | Arima | 340/664 X |
| 3,991,366 | 11/1976 | Schweitzer, Jr. | 340/664 X |
| 4,152,643 | 5/1979 | Schweitzer, Jr. | 324/133 X |
| 4,234,847 | 11/1980 | Schweitzer, Jr. | 324/133 UX |
| 4,424,512 | 1/1984 | Schweitzer, Jr. | 340/664 |
| 4,438,403 | 3/1984 | Schweitzer, Jr. | 340/664 X |

Primary Examiner—Stanley T. Krawczewicz
Attorney, Agent, or Firm—Lockwood, Alex, Fitzgibbon & Cummings

[57] ABSTRACT

A sensor for monitoring loss of voltage on a monitored conductor includes first and second capacitors, each of which is charged by a rectifier circuit which derives operating power from the monitored conductor. Upon loss of voltage on the conductor, a discharge circuit discharges the first capacitor, while allowing the second capacitor to remain charged. When the voltage difference between the two capacitors exceeds a predetermined threshold level, an SCR discharge circuit discharges the second capacitor to provide an output signal.

9 Claims, 10 Drawing Figures

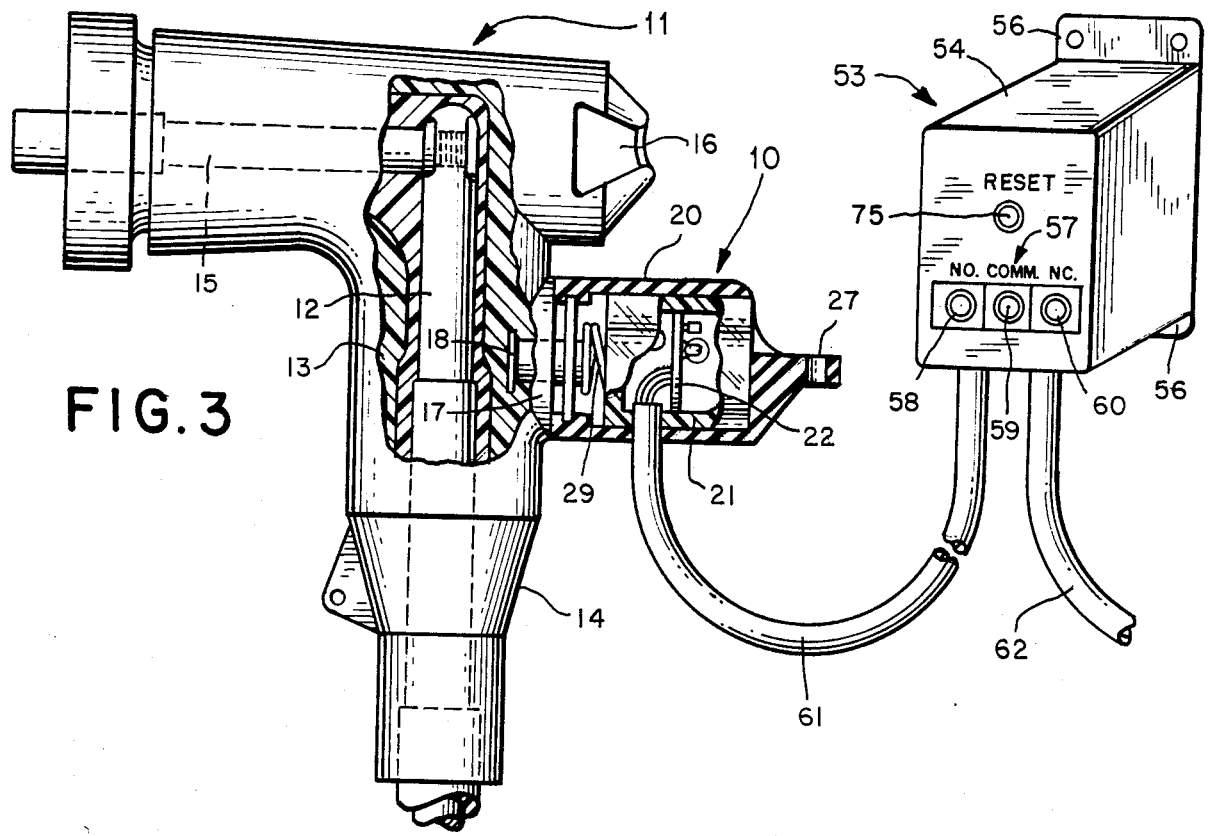
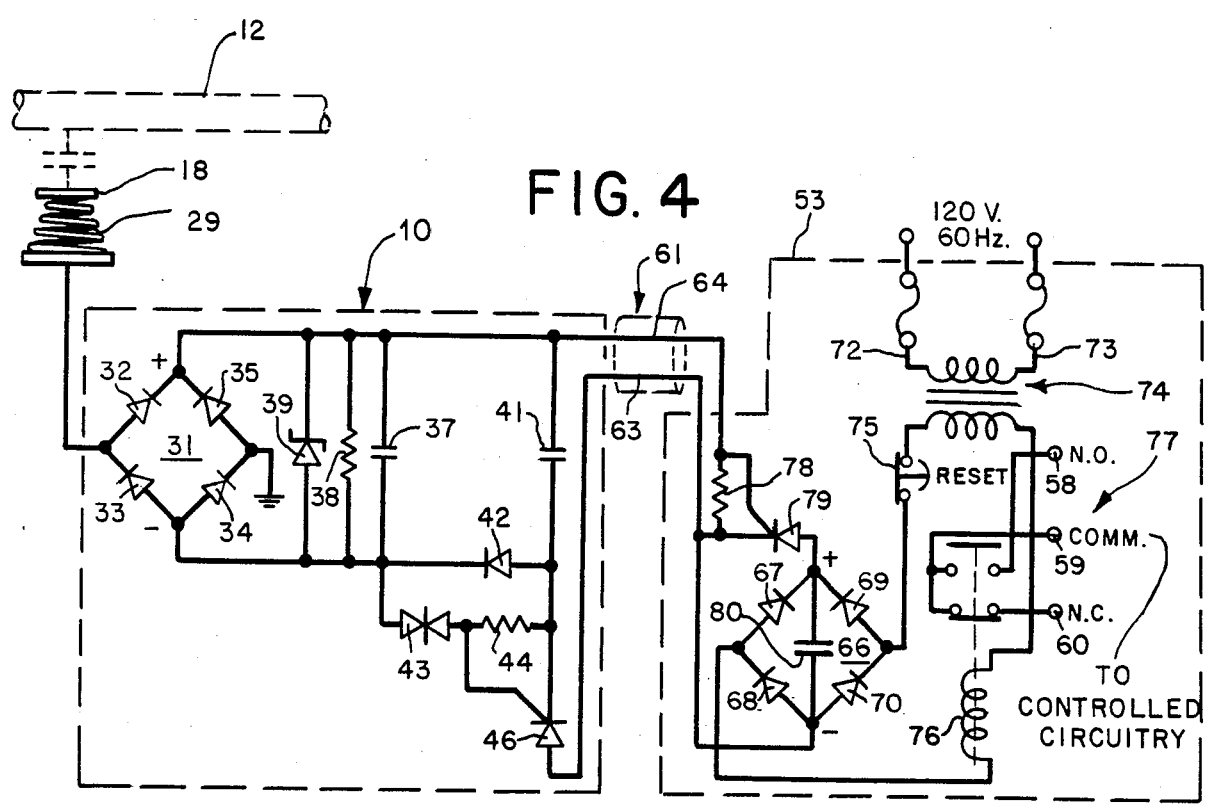

1

VOLTAGE LOSS SENSOR AND ALARM

BACKGROUND OF THE INVENTION

This invention relates generally to loss of voltage sensors, and in particular to circuitry for sensing the loss of voltage in a power distribution system.

It is often necessary in commercial electrical distribution systems that certain procedures be followed in the event of a power interruption. For example, some customers maintain their own electrical power generating equipment which must be started in the event of a power failure to maintain critical equipment in operation. Other customers automatically disconnect all electrical eqipment from the commercial power mains in the event of a power failure so that critical equipment can be reenergized in a deliberate and systematic manner after service is restored. Furthermore, in the case of multi-phase power systems, it is desirable to disconnect equipment following a failure in one supply phase in order to avoid potentially damaging single-phase operation. Voltage loss sensors, particularly those adapted for use with commercial power distribution systems, are useful for automatically implementing such procedures in the event of a power failure.

In the case of high voltage power mains, capacitive coupling of the loss of voltage sensor circuitry to the power mains is desirable in order to provide isolation from the high voltages present in the conductors. The loss of voltage sensor of the present invention utilizes such preferred capacitive coupling for both energization of its circuitry and for providing an alarm signal. With this sensor, coupling to the high voltage conductor of a power distribution system is readily accomplished at such conventional locations as underground cable termination test points, insulators, or by means of suitably insulated winding disposed within the electric field of the conductor.

Because the procedures to be followed in the event of a power failure vary from user to user and from situation to situation, the output response of a loss of voltage sensor should be suitable for actuating a variety of other cirucitry in the event of a power failure. Thus, a general type of electrical response, such as the closure of a set of relay contacts, is often a desirable output, since such a contact closure can easily be adapted to actuate other electrical systems and equipment.

Furthermore, since it is often desirable to monitor a number of different points in an electrical system, loss of voltage sensors may be used in great numbers. Consequently, it is desirable that such sensors be of relatively small physical size so as to facilitate placement within existing electrical systems. It is also desirable that such sensors be easily and economically manufactured so as to allow their wide spread use without excessive cost.

Accordingly, it is a general object of this invention to provide a new and improved loss of voltage sensor.

It is another object of this invention to provide a loss of voltage sensor suitable for use in conjunction with high voltage electrical power mains.

It is still another object of this invention to provide a new and improved loss of voltage sensor which may be energized and triggered by means of capacitive coupling to a high voltage power mains cable.

It is still another object of this invention to provide a new and improved loss of voltage sensor which may be easily and economically manufactured.

SUMMARY OF THE INVENTION

The invention is directed to a loss of voltage sensor for providing an output signal in response to the loss of voltage in a conductor of an electrical system. The sensor comprises a first capacitor, a second capacitor, and charge current producing means powered from the conductor for charging the first and second capacitors. First discharge means in circuit relationship with the first capacitor discharge only the first capacitor upon removal of charge current from the first capacitor. Voltage threshold means in circuit relationship with the first and second capacitors produce a trigger signal when the difference between the voltages of the first and second capacitors exceeds a predetermined level. Second discharge means in circuit relationship with the second capacitor and the voltage threshold means discharge the second capacitor in response to the trigger signal produced by the voltage threshold means to produce the output signal.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 3 is a side view partially in section of an alternate embodiment of the loss of voltage sensor of the invention wherein an external relay actuation circuit is provided.

FIG. 4 is an electrical schematic diagram of the loss of voltage sensor shown in FIG. 3.

DESCRIPTION OF THE PREFERRED EMBODIMENT

Figure 1:
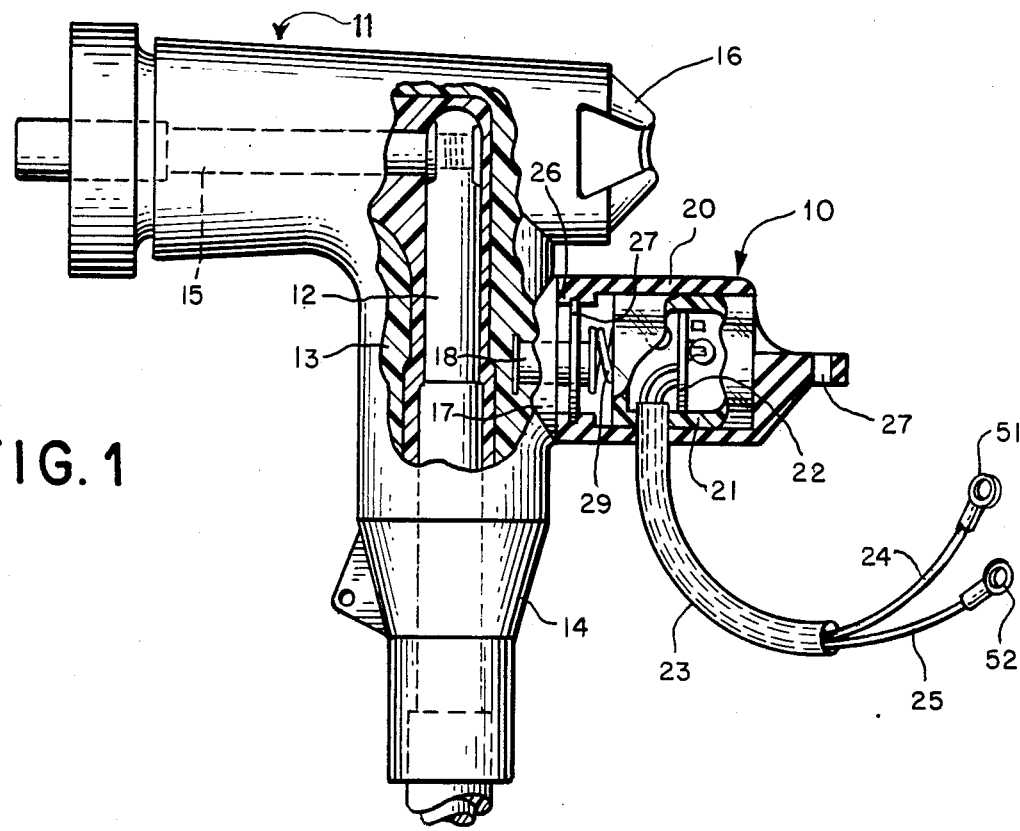
FIG. 1 is a side elevational view, partially in section, of a loss of voltage sensor constructed in accordance with the invention installed on the test point terminal of an elbow connector.

Referring to the drawings, and particularly to FIG. 1, a loss of voltage sensor 10 constructed in accordance with the invention is shown in conjunction with a conventional plug-in elbow connector 11 of the type commonly used in high voltage alternating current systems for establishing plus-in connections to transformers or other devices (not shown). As shown, the connector 11 includes generally an axial conductor 12 extending through an insulating jacket 13 encased in an electrically-conductive sheath 14, the sheath being grounded in accordance with conventional practice. A plug-in receptacle 15 extends from conductor 12 and is arranged to connect with a complementary contact on the transformer or device. A handling loop 16 having ends anchored in the conductive sheath 14 extends from the connector to receive the hooked end of a lineman's tool to facilitate removal of the connector from the transformer or other device.

In accordance with conventional practice, elbow connector 11 includes a test point terminal 17 which includes a contact 18 embedded in the end thereof. In operation, the loss of voltage sensor is mounted on the test point terminal, as illustrated in FIG. 1.

The loss of voltage sensor may comprise an electrically conductive hollow rubber outer shell 20 which is open at one end for mounting to the test point terminal 17. A correspondingly sized cylindrical plastic housing 21 containing the electrical components of the sensor circuit may be received within the interior portion of the outer shell. The electrical components of the sensor circuit may be mounted on a disc-shaped insulator board 22 transversely mounted within the plastic housing 21. In order to interconnect the loss of voltage sensor with other equipment, such as some form of alarm system, the sensor includes an electrical cable 23 extending through an aperture in the lower surface of outer shell 20. A pair of conductors 24 and 25 within the cable connect at one end to appropriate terminals of board 22, and at their other end to respective lug terminals for connection to the equipment to be controlled (not shown).

When the loss of voltage sensor is installed on the test point terminal 17, an annular end flange portion 26 of the outer shell snaps over an annular rib portion 27 on the test point. At the closed end of the outer shell, an aperture 28 may be provided to facilitate removal of the loss of voltage sensor from the test point with a conventional hooked lineman's tool.

The insulator board 22 is preferably mounted perpendicular to the axis of the plastic housing 21 in a location intermediate the ends thereof, and may be secured in position by an epoxy material within the housing. An electrical connection is established between the sensor circuitry and the electrical contact 18 by means of a helical spring 29 which extends from the circuit board at one end. The spring is resiliently pressed against contact 18 at its other end to establish the electrical connection. The electrical contact 18 is rigidly mounted within the insulating material of the test point terminal 17 so that one end of the contact is in proximity to the conductor 12. In this manner, capacitive coupling is established between the conductor 12 and the sensor circuitry, thereby providing operating power for the loss of voltage sensor 10. A feature of the loss of voltage sensor of the present invention is that satisfactory operation may be achieved with a capacitive coupling as low as 5 picofarads.

Figure 2:
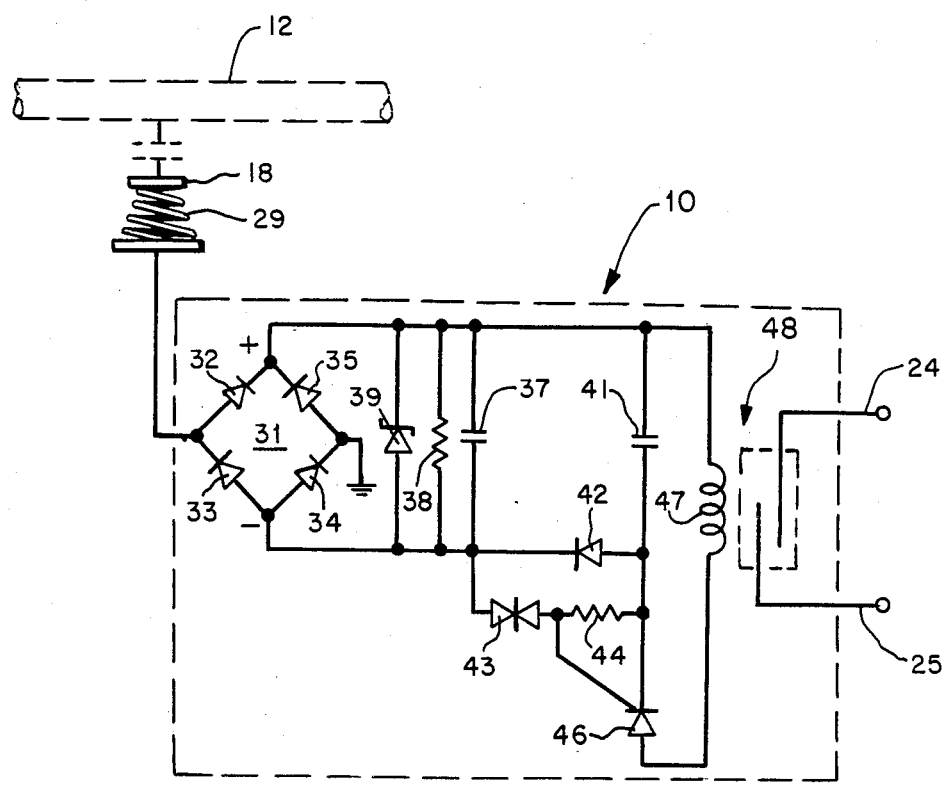
FIG. 2 is an electrical schematic diagram of the loss of voltage sensor shown in FIG. 1.

Referring to FIG. 2, the loss of voltage sensor circuit includes means for producing a charge current in response to the presence of voltage on the monitored conductor in the form of a bridge rectifier 31 comprising four diodes 32-35. Electrical contact 18 is electrically connected through helical spring 29 to one input terminal of rectifier network 31 formed at the junction of the anode of diode 32 and cathode of diode 33. The other input terminal of the bridge rectifier network, formed at the cathode of diode 34 and the anode of diode 35, is connected to ground through the conductive sheath 14 of the elbow connector. The positive polarity output terminal of the bridge rectifier network is formed at the cathodes of diodes 32 and 35, while the anodes of diodes 33 and 34 form the negative polarity output terminal. With this arrangement, alternating current capacitively applied to the bridge rectifier input terminals appears as pulsating unidirectional current at the rectifier output terminals.

The pulsating unidirectional current at the output terminals of the bridge rectifier network is applied to a first capacitor 37 connected between the positive and negative polarity terminals of the rectifier network. First capacitor discharge means in the form of a resistor 38 connected in parallel across capacitor 37 provide a discharge path for the capacitor. A reverse-biased zener diode 39, also connected in parallel across the output terminals of the bridge rectifier network, limits the bridge rectifier output voltage to the zener breakdown voltage, which in this embodiment is approximately 50 volts.

A second capacitor 41 is connected at one terminal to the positive polarity output terminal of the bridge rectifier, and at its other terminal to the anode of a diode 42. The cathode of diode 42 is connected to the negative output terminal of the bridge rectifier thereby allowing the unidirectional current pulses produced by the bridge rectifier to charge the second capacitor 41. Voltage threshold means for producing an output signal are included in the form of a bilateral diode 43 and series-connected resistor 44 connected across diode 42.

In normal operation, with voltage present on conductor 12, the unidirectional current pulses produced by the bridge rectifier network 31 are applied directly to capacitor 37, and through diode 42 to capacitor 41 to simultaneously charge the two capacitors. In a 60 hertz system, the unidirectional current pulses are produced at a rate of 120 hertz. The first capacitor discharge time constant, determined primarily by the respective values of capacitor 37 and resistor 38, is sufficiently long so that the first capacitor remains substantially fully charged between charge current pulses.

In the event of a power failure in conductor 12, the output of the bridge rectifier network drops to zero, whereupon capacitor 37 discharges through resistor 38. The decreasing voltage of discharging capacitor 37 causes diode 42 to become reverse biased, thereby preventing discharge of capacitor 41 through resistor 38. The voltage difference between the discharging first capacitor 48 and the charged second capacitor 41 appearing across diode 42, is applied to bilateral diode 43 and series resistor 44. When the voltage differential between the first and second capacitor voltages exceeds the bilateral diode threshold voltage, the resistance of the diode drops thereby allowing capacitor 41 to discharge through resistor 44, bilateral diode 43 and resistor 38.

The current through resistor 44 produces a trigger signal across the resistor. This trigger signal is applied to second capacitor discharge means in the form of an SCR 46 having its cathode connected to the negative polarity terminal of capacitor 41 and one end of resistor 44, and its gate connected to the other end of the resistor. The anode of SCR 46 is connected through a magnetic coil 47 associated with a magnetic reed switch 48, to the positive polarity terminal of capacitor 41. With this arrangement, the trigger signal produced across resistor 44 when the difference between the first and second capacitor voltages exceeds the bilateral diode breakdown voltage, causes SCR 46 to become conductive, whereupon capacitor 41 discharges through the SCR and the magnetic reed switch coil 47. The resulting current pulse through coil 47 causes the magnetic reed switch contacts to close, thereby providing momentary electrical continuity between conductors 24 and 25 and their associated end terminals. This momentary continuity between the terminals can in turn be used to trigger a wide variety of externally connected electrical equipment. It will be appreciated that the magnetic reed switch 48 may be replaced with other current or voltage sensitive switching devices to provide switching outputs other than the simple switch contact closure shown in the embodiment described.

In a typical embodiment intended for use with a 60 hertz alternating current power distribution system, capacitor 37 may have a value of 0.15 microfarads, capacitor 41 may have a value of 2 microfarads, and the discharge resistor 38 may have a value in the range of 5-10 megaohms. These component values result in a first capacitor discharge time constant of approximately 0.75 to 1.5 seconds. A time constant of this order allows the voltage loss sensor circuitry to remain insensitive to momentary voltage losses of short duration, such as those occurring during switching operations. Typically, the bilateral diode 43 may have a threshold voltage of 32 volts, and resistor 44 may have a value of 330 ohms. It will be appreciated that, in practice, bilateral diode 43 may be replaced with a silicon unilateral switch (SUS), which would permit diode 42 to be eliminated.

An alternate embodiment of the invention is shown in FIGS. 3 and 4. As shown, the loss of voltage sensor includes a test point cap housing 20 of known construction, mounted on the test point terminal 17 of a conventional elbow connector 11. As before, the components comprising the sensor circuit are mounted on a disc-shaped insulation board 22 mounted within the outer shell 20 and plastic housing 21 of the test point cap.

To provide means for actuating other equipment in the event of a power failure, the loss of voltage sensor shown in FIG. 3 includes a switch unit indicated generally at 53. The switch unit includes a generally rectangular switch housing 54 containing the switch circuitry. Mounting flanges 56, provided along the upper and lower edges of the rear surface of the switch housing, provide means for securing the unit to a wall or other suitable surface. A terminal block 57 on the front surface of the switch unit provides electrical connection with "normally-open", "common" and "normally-closed" switch contacts through terminals 58, 59 and 60, respectively. A reset pushbutton 75 for resetting the switch unit is provided on the front surface of the switch unit housing. The voltage sensor circuitry contained within the outer shell 20 is electrically connected with the switch unit 53 by means of a two conductor electrical cable 61 permanently connected at one end to the voltage sensor circuitry and removably connected at the other end with the switch unit through a detachable connector (not shown). Power, such as that obtainable from a 120 volt, 60 hertz alternating current source, is supplied to the switch unit through power cord 62.

Referring to FIG. 4, capacitive coupling to the high voltage alternating current conductor 12 is provided as in the embodiment of FIGS. 1 and 2 by means of an electrical contact 18 embedded in the insulating material 13 of elbow connector 11 in proximity to conductor 12. Helical spring 29 electrically connects contact 18 with the input terminal of the bridge rectifier 31 formed by diodes 32-35. The other input terminals of the bridge rectifier network is connected to ground through the electrically conducting sheath 14 of the elbow connector 11. The pulsating unidirectional current provided at the output terminals of the bridge rectifier network is applied to a first capacitor 37 connected across the output terminals of the rectifier network, and through a diode 42 to a second capacitor 41 whereby each of the capacitors is charged by the bridge rectifier output current pulses. Zener diode 39, in parallel with capacitor 37, limits the output voltage from the bridge rectifier network to the zener breakdown voltage of the diode. Parallel resistor 38 provides a discharge path for capacitor 37.

In the event that voltage is lost in conductor 12, the output of the bridge rectifier network drops to zero. Since the unidirectional current pulses are no longer available to charge capacitors 37 and 41, capacitor 37 discharges through resistor 38. Diode 42 prevents capacitor 41 from also discharging through resistor 38. Since the resistance of the discharge path for the second capacitor 41 is extremely large when diode 42 is reverse biased, the capacitor remains substantially fully charged during the time capacitor 37 discharges through resistor 38. Consequently, a voltage differential exists between the first and second capacitors while the first capacitor discharges.

When the difference in capacitor voltages exceeds a predetermined level, voltage threshold means in the form of the bilateral threshold diode 43 and series-connected resistor 44 become conductive, allowing second capacitor 41 to discharge through the bilateral diode 43 and resistor 44 to produce a trigger signal. This trigger signal is applied to the gate of SCR 46, the cathode of which is connected to the negative polarity terminal of capacitor 41. With this arrangement, SCR 46 is triggered by the positive polarity trigger signal applied to its gate by reason of capacitor 41 partially discharging through the bilateral diode 43 and resistor 44, when the difference in the capacitor voltages exceeds the threshold voltage of diode 43.

The anode of SCR 46 forms one output terminal of the sensor circuit. This output terminal is connected by means of a conductor 63 of two conductor cable 61 to an input terminal of the switch unit 53. The other output terminal of the sensor unit 20, corresponding to the positive polarity output terminal of the bridge rectifier network, is connected with the switch unit through a conductor 64 of cable 61. When SCR 46 is triggered, thereby rendering it conductive, a discharge path for capacitor 41 is provided through the output terminals of the loss of voltage sensor circuit.

The switch unit circuitry includes a bridge rectifier network 66 comprising diodes 67-70. External power, such as 120 volt, 60 hertz alternating current, is applied through two fused leads 72 and 73 to the primary winding of an isolation transformer 74, which provides isolation between the commercial power distribution system and the circuitry of the loss of voltage sensor and switch unit. One end of the isolation transformer secondary winding is connected through a reset pushbutton 75 to the input terminal of the bridge rectifier formed by the anode of diode 69 and the cathode of diode 70, while the other transformed secondary lead is connected through a relay winding 76 of a SPDT relay 77 to the bridge rectifier input terminal formed at the anode of diode 67 and the cathode of diode 68. Conductor 63 of cable 61 interconnects the anode of SCR 46 with the positive polarity output terminal of the bridge rectifier formed at the anodes of diodes 68 and 70. A resistor 78 is connected between conductors 63 and 64 of the two conductor cable 61.

The switch unit circuitry further includes an SCR 79, the cathode of which is connected to conductor 63 and to one terminal of resistor 78. The gate of SCR 79 is connected to conductor 64 and the other terminal of resistor 78. The anode of SCR 79 is connected to the bridge rectifier network output terminal formed at the junction of the cathodes of diodes 67 and 69.

While SCR 79 is in an off or non-conducting state, the bridge rectifier appears electrically as an open circuit between the bridge rectifier output terminals. Consequently, the secondary circuit of the isolation transformer 74 is open, and relay 77 is not energized. However, when SCR 79 is triggered to its on or conductive state, a low impedance circuit path is provided between the bridge rectifier output terminals. This causes the transformer secondary circuit to become closed, whereupon current passing through relay winding 76 conditions relay 77 to its actuated state. In this embodiment, the relay contacts shown form a single pole double throw switch. It will be appreciated, that other relay contact configurations as well as other current or voltage sensitive switching devices may be substituted for the relay 77 shown in FIG. 4.

A capacitor 80 connected between the output terminals of rectifier 66, filters the bridge rectifier output to maintain SCR 79 conductive. Consequently, relay 66 will remain energized until such time as reset pushbutton 75 is depressed to open the transfromer secondary circuit.

In the event of a loss of voltage in conductor 12, SCR 46 becomes conductive in the manner previously described, whereupon capacitor 41 discharges through the series combination of SCR 46, conductors 63, 64 and resistor 78. The discharge of capacitor 41 produces a control signal which comprises a unidirectional current pulse having a high initial value, which thereafter drops off with a time constant determined primarily by the values of capacitor 41 and resistor 78. This control signal causes relay 77 to be energized, thereby providing a switch response at output terminals 58, 59 and 60 of the switch unit. The switch response provided at these terminals may be used to actuate alarm means or other means for producing a desired response in the event of a power failure.

Figure 5:
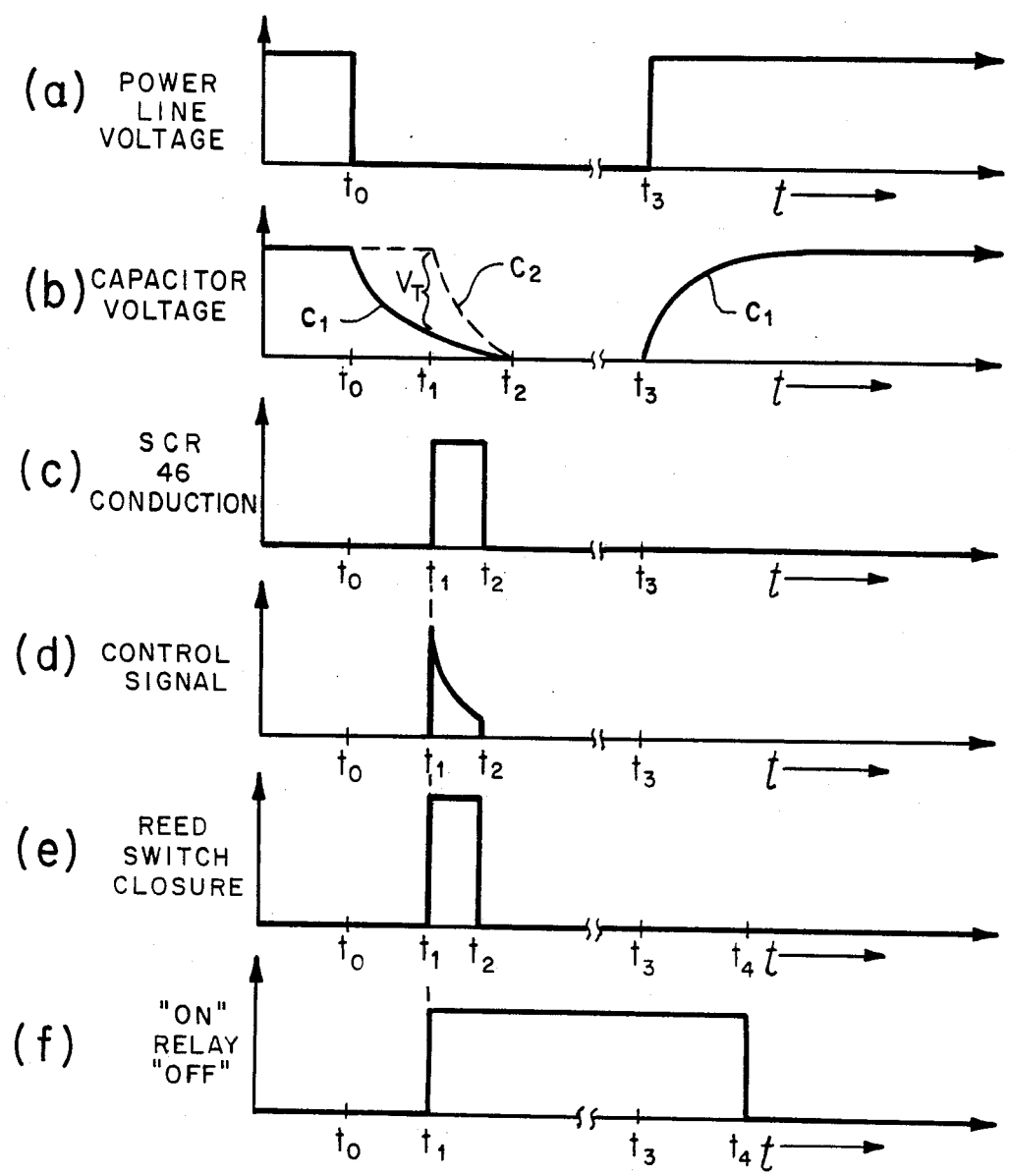
FIGS. 5(a)–5(f) are a depiction of certain time, voltage and current relationships of the loss of voltage sensor useful in understanding the operation thereof.

FIGS. 5(a) through 5(f) depict various waveform characteristics of the loss of voltage sensor circuits shown in FIGS. 1-4. FIG. 5(a) shows power line voltage dropping from normal operational voltage to 0 volts following a power failure at time $t_0$. As illustrated, power is restored to the system at time $t_3$. The voltage waveforms of capacitors 37 and 41 are illustrated in FIG. 5(b) as $C_1$ and $C_2$, respectively. When power line voltage drops to zero at time $t_0$, capacitor 37 voltage falls as shown as the capacitor discharges through resistor 38. At time $t_1$, the difference between the first and second capacitor voltages equals the threshold voltage $V_T$ of the bilateral diode 43. When this threshold voltage is reached, SCR 46 becomes conductive as shown in FIG. 5(c). The time delay between times $t_1$ and $t_0$ is a function of both the discharge time constant of capacitor 37 and the bilateral diode threshold voltage $V_T$. In a typical embodiment, with the component values previously mentioned, this delay may be on the order of 0.1 second. SCR 46 will remain conductive as long as the forward current through the diode remains above a characteristic threshold value. The control signal current through SCR 46 is that current supplied by capacitor 41, and is illustrated in FIG. 5(d). Time $t_2$ is the time at which the control signal current drops to the value at which SCR 46 no longer remains conductive. Consequently, SCR 46 will remain on for the period between $t_1$ and $t_2$.

In the embodiment shown in FIGS. 1 and 2, the magnetic reed switch contacts will remain closed as long as the current through the reed switch winding remains above a characteristic level. FIG. 5(e) depicts the closure of the reed switch contacts at time $t_1$. The switch contacts remain closed until the control signal current drops at $t_2$.

In the circuit shown in FIG. 4, relay 80 remains actuated as illustrated in FIG. 5(f) until the reset button is depressed at $t_4$.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A loss of voltage sensor for producing an output signal in response to the loss of voltage in a conductor of an electrical system, comprising:
   a first capacitor;
   a second capacitor;
   charge current producing means powered from the conductor for charging said first and second capacitors;
   first discharge means in circuit relationship with said first capacitor for discharging only said first capacitor upon removal of charge current from said first capacitor;
   voltage threshold means in circuit relationship with said first and second capacitors for producing a trigger signal when the difference between the voltages of said first and said second capacitors exceeds a predetermined value; and
   second discharge means in circuit relationship with said second capacitor and said voltage threshold means for discharging said second capacitor in response to said trigger signal produced by said voltage threshold means to produce said output signal.

2. A loss of voltage sensor as defined in claim 1 wherein said means for producing a charge current comprise a bridge rectifier network capacitively coupled to the conductor.

3. A loss of voltage sensor as defined in claim 1 wherein said first discharge means comprises a resistor in parallel circuit relationship with said first capacitor.

4. A loss of voltage sensor as defined in claim 1 wherein said voltage threshold means include a bilateral diode and series resistor connected between like-polarity terminals of said capacitors whereby said trigger signal is produced across said resistor.

5. A loss of voltage sensor as defined in claim 1 wherein said second discharge means include a silicon controlled rectifier in circuit relationship with said second capacitor.

6. A loss of voltage sensor as defined in claim 1 wherein the discharge time constant of said first capacitor and said first discharge means sufficiently exceed the pulse period of said charge current so that said first capacitor remains substantially fully charged between said charge current pulses.

7. A loss of voltage sensor for detecting the loss of voltage in a conductor in an electrical system comprising:
   a bridge rectifier for producing periodic unidirectional charge current pulses in response to the presence of alternating polarity voltage on the conductor of an electrical system;

a first capacitor connected in parallel circuit relationship with the output of said bridge rectifier whereby said periodic unidirectional charge current pulses charge said first capacitor;

a first resistor in parallel circuit relationship with said first capacitor for discharging said first capacitor upon cessation of the production of current pulses at the output of said bridge rectifier network;

a second capacitor in circuit relationship with said first capacitor;

isolation means for preventing said second capacitor from discharging through said first resistor;

a second resistor having one terminal connected to the one terminal of said second capacitor;

a bilaterial diode connected at one terminal to the other terminal of said second resistor and at the other terminal to one terminal of said first capacitor; and a switch device having its anode connected to one terminal of said second capacitor, its cathode connected to an output terminal and its gate connected to the junction of said terminal of said bilateral diode and said other terminal of said second resistor, whereby said switch device is rendered conductive to couple said second capacitor to said output terminal upon the voltage differential between said capacitors exceeding the threshold level of said bilateral diode.

8. A loss of voltage sensor as defined in claim 7 wherein the discharge time constant of said first capacitor and said first resistor sufficiently exceeds the period of said charge current so that said first capacitor remains substantially fully charged between said charge current pulses.

9. A loss of voltage sensor as defined in claim 7 wherein said isolation means comprise a diode connected between like polarity terminals of said first and second capacitors, said diode being reverse biased upon partial discharge of said first capacitor.

* * * * *